United States Patent
Gomi et al.

(10) Patent No.: US 8,408,025 B2
(45) Date of Patent: Apr. 2, 2013

(54) RAW MATERIAL RECOVERY METHOD AND TRAPPING MECHANISM FOR RECOVERING RAW MATERIAL

(75) Inventors: Atsushi Gomi, Nirasaki (JP); Yasushi Mizusawa, Nirasaki (JP); Tatsuo Hatano, Nirasaki (JP); Masamichi Hara, Nirasaki (JP); Kaoru Yamamoto, Nirasaki (JP); Chiaki Yasumuro, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 60 days.

(21) Appl. No.: 13/057,372

(22) PCT Filed: Aug. 4, 2009

(86) PCT No.: PCT/JP2009/063824
§ 371 (c)(1),
(2), (4) Date: May 2, 2011

(87) PCT Pub. No.: WO2010/016500
PCT Pub. Date: Feb. 11, 2010

(65) Prior Publication Data
US 2011/0203310 A1 Aug. 25, 2011

(30) Foreign Application Priority Data
Aug. 7, 2008 (JP) ................................. 2008-204767

(51) Int. Cl.
| F25J 1/00 | (2006.01) |
| F25J 1/02 | (2006.01) |
| C23C 16/00 | (2006.01) |
| B01D 47/00 | (2006.01) |
| B01J 19/00 | (2006.01) |

(52) U.S. Cl. ................ 62/601; 95/205; 96/234; 96/243; 422/168; 422/187; 118/715; 118/75

(58) Field of Classification Search .................... 62/601; 95/205; 96/234, 243; 422/168, 187; 118/715, 118/75
See application file for complete search history.

(56) References Cited

U.S. PATENT DOCUMENTS
4,886,444 A 12/1989 Hirase et al.
(Continued)

FOREIGN PATENT DOCUMENTS
EP 0296944 B1 9/1990
(Continued)

OTHER PUBLICATIONS
International Search Report for International Application No. PCT/JP2009/063824 with English translation mailed on Oct. 13, 2009.

*Primary Examiner* — Timothy Vanoy
(74) *Attorney, Agent, or Firm* — Abelman, Frayne & Schwab

(57) ABSTRACT

A raw material recovery method for recovering a raw material of an organic metallic compound, which has the property of being stable toward a specific refrigerant without being decomposed thereby, from exhaust gas discharged from a treatment container in which a metallic thin film is formed on the surface of an object to be treated by using source gas obtained by vaporizing the raw material is characterized by being provided with a solidification step for solidifying the unreacted source gas by cooling the exhaust gas by bringing the exhaust gas into contact with the refrigerant and reprecipitating the raw material, and a recovery step for separating and recovering the raw material reprecipitated in the solidification step from the refrigerant. To provide a method for controlling an exhaust gas flow rate so that flow of gas in a processing chamber becomes uniform.

15 Claims, 7 Drawing Sheets

U.S. PATENT DOCUMENTS

| | | | |
|---|---|---|---|
| 5,704,214 A | 1/1998 | Fujikawa et al. | |
| 6,500,487 B1 | 12/2002 | Holst et al. | |
| 6,833,024 B2 | 12/2004 | Holst et al. | |
| 6,884,463 B2 | 4/2005 | Kitada et al. | |
| 7,419,699 B2 | 9/2008 | Kitada et al. | |
| 2001/0036509 A1* | 11/2001 | Kitada et al. | 427/255.28 |
| 2003/0141016 A1 | 7/2003 | Okase et al. | |
| 2008/0121181 A1 | 5/2008 | Kitada et al. | |
| 2010/0061908 A1* | 3/2010 | Smith | 423/240 R |
| 2010/0126349 A1* | 5/2010 | Vermeulen | 95/229 |

FOREIGN PATENT DOCUMENTS

| | | |
|---|---|---|
| EP | 1230420 A1 | 8/2002 |
| JP | 1-288317 A | 11/1989 |
| JP | 8-290050 A | 11/1996 |
| JP | 2001-44185 A | 2/2001 |
| JP | 2001-214272 A | 8/2001 |
| JP | 2001-342566 A | 12/2001 |
| JP | 2003-512528 A | 4/2003 |
| JP | 2003-135926 A | 5/2003 |
| JP | 2007-268445 A | 10/2007 |
| JP | 2009-62599 A | 3/2009 |
| WO | 01/29281 A1 | 4/2001 |
| WO | 2009/034865 A1 | 3/2009 |

* cited by examiner

A

B

A

B

RAW MATERIAL RECOVERY METHOD AND TRAPPING MECHANISM FOR RECOVERING RAW MATERIAL

This is a U.S. national stage application of International Application No. PCT/JP2009/063824, filed on 4 Aug. 2009. Priority under 35 U.S.C. §119(a) and 35 U.S.C. §365(b) is claimed from Japanese Application No. JP2008-204767, filed 7 Aug. 2008, the disclosure of which is also incorporated herein by reference.

FIELD OF THE INVENTION

The present invention relates to a raw material recovery method for recovering an unreacted source gas in a discharged gas from a film forming apparatus, and a trapping mechanism for recovering the raw material.

BACKGROUND ART

In general, upon manufacturing an integrated circuit (IC) or a logic circuit, a process for forming a desired thin film on a surface of an object to be treated such as a semiconductor wafer or a LCD substrate, or a process for etching the thin film in a desired pattern, etc., are repeatedly performed.

Taking a film forming process as an example, it is possible to form a thin film of a silicon, a thin film of a silicon oxide or nitride, a metallic thin film, or a thin film of a metal oxide or nitride on the surface of the object to be treated, by reacting predetermined process gases (source gas) within a treatment container.

Herein, when the film forming process is performed, an extra reaction by-product is generated and discharged with an exhaust gas. Also, an unreacted process gas is discharged.

The reaction by-products or unreacted process gases become a cause of an environmental pollution when discharged directly to the atmosphere. Accordingly, in general, a trapping mechanism which is provided in an exhaust system extending from the process vessel has trapped and removed, for example, the reaction by-product or unreacted process gas contained in the exhaust gas.

Various configurations of the trapping mechanism have been proposed depending upon the properties of the reaction by-product to be trapped and removed. For example, the trapping mechanism for removing a reaction by-product which is condensed (liquefied) or coagulated (solidified) in a room temperature, is constituted by installing a plurality of fins in a case having an exhaust gas inlet and outlet. The fins are sequentially arranged in a flow direction of the exhaust gas, and the reaction by-product is caused to be trapped in such a manner that the reaction by-product in the exhaust gas is attached to the surface of the fins when the exhaust gas flows between the fins. Further, by cooling the fins with a cooling medium etc., it is possible to improve the trapping efficiency (see, for example, Japanese Patent Laid-open Publication No. 2001-214272).

Recently, in order to decrease resistances such as a wiring resistance, or a contact resistance, a raw material (source gas) of an organic metallic compound containing a metal such as silver, gold and ruthenium has been used to form a thin film by a film forming apparatus. In this case, a method has been proposed for recovering the by-product containing unreacted raw material, by cooling and condensing the exhaust gas and also refining the by-product to obtain the unreacted raw material (see, for example, Japanese Patent Laid-open Publication No. 2001-342566).

However, when the above mentioned organic metallic compound is used, there may be a reaction type in which the organic metallic compound is not dissolved in water well and a product other than a reaction by-product generated by the decomposition of the raw material itself is not generated, as in a carbonyl based organic metallic compound. In this case, when the recovery method including a refining process mentioned in Japanese Patent Laid-open Publication No. 2001-342566 is used, an overall process becomes too complex.

DISCLOSURE OF THE INVENTION

Problems to be Solved by the Invention

The present invention has been made to solve the above problem efficiently. The purpose of the present invention is to provide a raw material recovery method and a trapping mechanism for recovering the raw material capable of recovering an unreacted raw material in a simple and easy manner when forming a thin film on the surface of the object to be treated, by using a raw material of an organic metallic compound which has the property of being stable toward a specific refrigerant without being decomposed.

Another purpose of the present invention is to provide a raw material recovery method and a trapping mechanism for recovering the raw material capable of recovering an unreacted raw material in a simple and easy manner when forming a thin film on the surface of the object to be treated by using a raw material of an organic metallic compound which is dissolved in a specific solvent.

Means to Solve the Problem

The present invention provides a raw material recovery method for recovering a raw material of an organic metallic compound, which has the property of being stable toward a specific refrigerant without being decomposed thereby, from an exhaust gas discharged from a treatment container in which a metallic thin film is formed on the surface of an object to be treated by using source gas obtained by vaporizing the raw material. The method is characterized by comprising a solidification step for solidifying the unreacted source gas by cooling the exhaust gas by bringing the exhaust gas into contact with the refrigerant and reprecipitating the raw material, and a recovery step for separating and recovering the raw material reprecipitated in the solidification step from the refrigerant.

According to the present invention, it is possible to recover an unreacted raw material in a simple and easy manner when forming a thin film on the surface of the object to be treated by using a raw material of an organic metallic compound which has the property of being stable toward a specific refrigerant without being decomposed, since the unreacted source gas is solidified by cooling the exhaust gas by bringing the exhaust gas into contact with the refrigerant and reprecipitated as the raw material, and the raw material is separated from the refrigerant.

Preferably, in the recovery step, a filtration method for filtering the refrigerant or an evaporation method for evaporating the refrigerant is used.

Further, the refrigerant is preferably cooling water.

Alternatively, the present invention provides a raw material recovery method for recovering a raw material of an organic metallic compound, which is dissolved in a specific solvent, from an exhaust gas discharged from a treatment container in which a metallic thin film is formed on the surface of an object to be treated by using source gas obtained by vaporizing the raw material. The method is characterized by comprising a dissolution step for dissolving the unreacted source gas by bringing the exhaust gas into contact with the solvent, and a recovery step for reprecipitating and recovering the raw material dissolved in the solvent by evaporating the solvent.

According to the present invention, it is possible to recover an unreacted raw material in a simple and easy manner when forming a thin film on the surface of the object to be treated by using a raw material of an organic metallic compound which is dissolved in a specific solvent, since the unreacted source gas is dissolved by bringing the exhaust gas into contact with the solvent, and the raw material is reprecipitated by evaporating the solvent.

Preferably, the solvent includes at least one compound selected from the group consisting of alcohols, alkanes, ethers and aromatic hydrocarbons.

In addition, the present invention provides a trapping mechanism for recovering a raw material of an organic metallic compound, which has the property of being stable toward a specific refrigerant without being decomposed thereby, from an exhaust gas discharged from a treatment container in which a metallic thin film is formed on the surface of an object to be treated by using source gas obtained by vaporizing the raw material. The mechanism is characterized by comprising a solidification unit for solidifying the unreacted source gas by cooling the exhaust gas by bringing the exhaust gas into contact with the refrigerant and reprecipitating the raw material, and a filtration recovery unit for separating and recovering the reprecipitated raw material from the refrigerant, by filtering the refrigerant in the solidification unit.

For example, the solidification unit uses cooling water as the refrigerant.

Further, for example, the solidification unit includes any one device selected from the group consisting of a scrubber device, a water ring pump device and a bubbling device.

Also, for example, the filtration recovery unit includes a circulation passage which is provided with a circulation pump and circulates the refrigerant containing the reprecipitated raw material in the solidification unit and a recovery container which is provided in the circulation passage and has a filter recovering the reprecipitated raw material from the refrigerant by filtration.

In this case, it is preferred that pluralities of recovery containers having the filter are provided in parallel so as to be used selectively with respect to the circulation passage.

Further, the present invention provides a trapping mechanism for recovering a raw material of an organic metallic compound which is dissolved in a specific solvent, from an exhaust gas discharged from a treatment container in which a metallic thin film is formed on the surface of an object to be treated by using source gas obtained by vaporizing the raw material. The mechanism is characterized by comprising a dissolution unit for dissolving the unreacted source gas of the exhaust gas in the solvent by bringing the exhaust gas into contact with the solvent, and an evaporation recovery unit for reprecipitating and recovering raw material dissolved in the solvent, by evaporating the solvent extracted from the dissolution unit.

For example, the dissolution unit includes any one device selected from the group consisting of a scrubber device, a water ring pump device and a bubbling device.

Further, the present invention provides an exhaust system to be connected to a treatment container in which a metallic thin film is formed on the surface of an object to be treated by using source gas obtained by vaporizing the raw material of an organic metallic compound which has the property of being stable toward a specific refrigerant without being decomposed. The exhaust system is characterized by comprising an exhaust passage connected to an outlet of the treatment container, a vacuum pump unit provided in the exhaust passage, the trapping mechanism having any one of the above characteristics and provided in the exhaust passage, and a detoxifying device making a harmful gas in the exhaust gas harmless and provided at the downstream of the trapping mechanism.

Preferably, an auxiliary trapping mechanism for cooling the exhaust gas and recovering the unreacted source gas contained in the exhaust gas is provided at the upstream of the trapping mechanism.

In this case, it is preferred that the auxiliary trapping mechanism includes a Cryo pump.

Further, preferably, the exhaust system further includes a pressure regulating valve provided in the exhaust passage for controlling the pressure in the treatment container.

In addition, the present invention provides a film forming apparatus for performing a film forming process for an object to be treated. The film forming apparatus includes a treatment container configured to be evacuated, a holing means for holding the object to be treated in the treatment container, a heating means for heating the object to be treated, a gas introducing means for introducing a gas into the treatment container, a source gas supply system connected to the gas introducing means, and the exhaust system having any one of above characteristics and connected to the treatment container.

Furthermore, in each of the above inventions, it is preferred that the organic metallic compound is carbonyl based organic metallic compound.

For example, the carbonyl based organic metallic compound includes one or more materials selected from the group consisting of $Ru_3(CO)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$, $Ta(CO)_5$.

DETAILED DESCRIPTION

Hereinafter, by referring to the attached drawings, suitable embodiments of a raw material recovery method, a trapping mechanism for recovering the raw material, an exhaust system using the trapping mechanism, and a film forming device using the exhaust system according to the present invention will be described.

Figure 1:
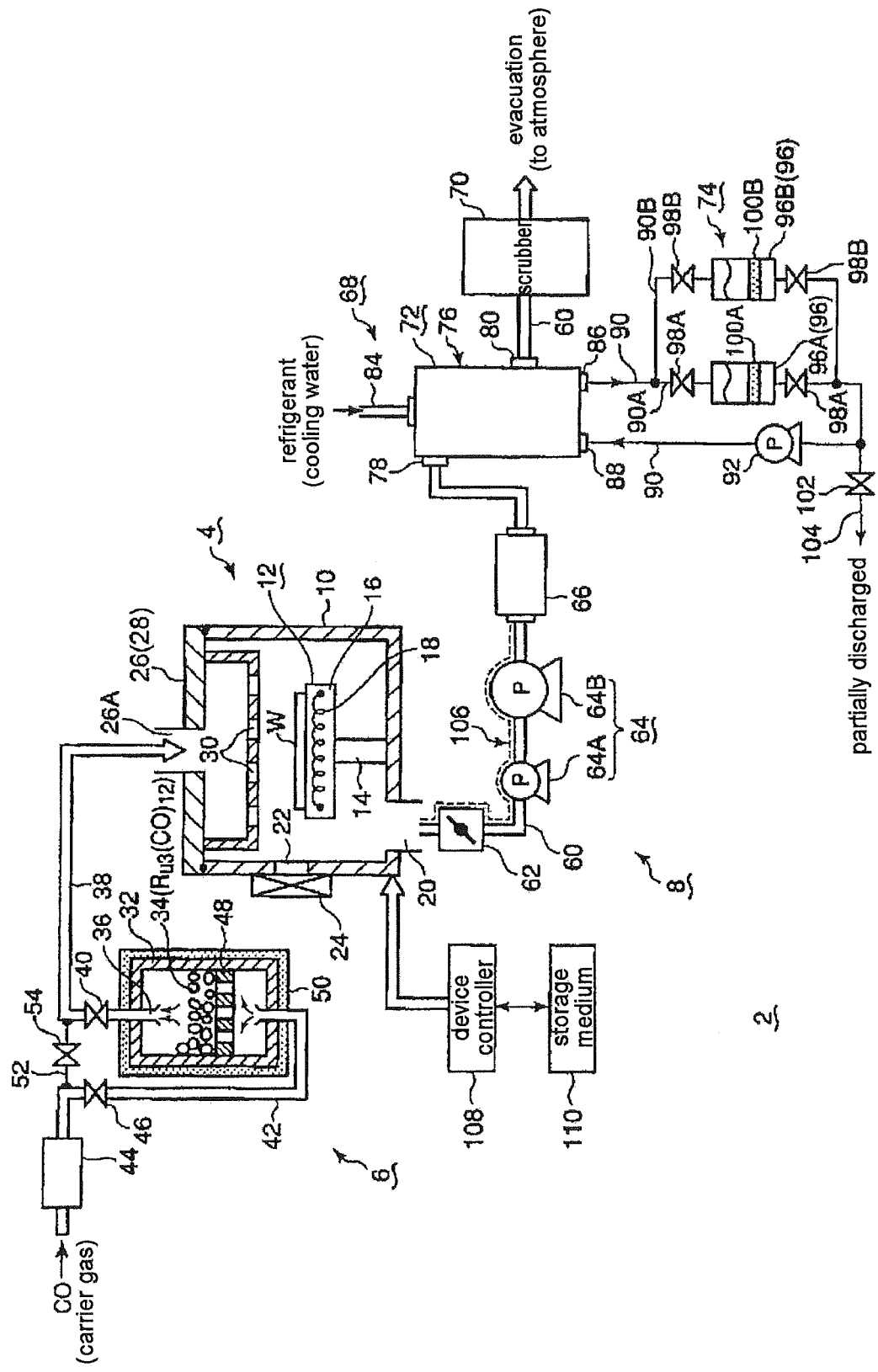
FIG. 1 is a schematic configuration view illustrating a film forming apparatus including a trapping mechanism, according to one embodiment of the present invention.

FIG. 1 is a schematic configuration view illustrating a film forming apparatus including a trapping mechanism according to one embodiment of the present invention. FIG. 2A and FIG. 2B are cross-sectional configuration view illustrating one example of a solidification unit included in the trapping mechanism. Herein, a case will be described as an example in which, as a raw material of an organic metallic compound, $Ru_3(CO)_{12}$ being an carbonyl based organic metallic compound is supplied together with CO (carbon monoxide) being a carrier gas for forming a thin film of Ru being metallic thin film.

As shown in FIG. 1, a film forming apparatus 2 according to the present embodiment is mainly constituted with a main body 4 of the film forming apparatus practically performing a film forming process for a semiconductor W as an object to be treated, a source gas supply system 6 supplying a source gas for film forming to main body 4 of the film forming apparatus, and an exhaust system 8 discharging the exhaust gas from main body 4 of the film forming apparatus.

Firstly, main body 4 of the film forming apparatus will be described. Main body 4 of the film forming apparatus includes a cylindrical treatment container 10 made of aluminum alloy, for example. A holding means 12 for holding semiconductor wafer W as an object to be treated is provided within treatment container 10. Specifically, holding means 12 is constituted by a disc-shaped placing table 16 with a support 14 standing up from the bottom part of the treatment container. Wafer W is disposed on placing table 16. And, placing table 16 is made of a ceramic material such as AlN (Aluminum Nitride), for example. A heating element 18 made of tungsten wire, for example, is embedded in the placing table 16 so that wafer W can be heated. Herein, heating element 18 is not limited to the tungsten wire, and a heating lamp may be used, for example.

Treatment container 10 is provided at its bottom part with an exhaust outlet 20. Exhaust system 8 is connected to exhaust outlet 20 for evacuating the atmosphere in treatment container 10. The details of exhaust system 8 will be described later.

Treatment container 10 is formed at its side wall with an opening part 22 for carrying in/out wafer W. A gate valve 24 is provided at opening part 22 for hermetically opening/closing the opening part.

Treatment container 10 is provided at its ceiling part with a gas introduction means 28 constituted with a shower head 26, for example, and necessary gas is introduced through a gas discharge opening 30 formed at a lower surface of gas introduction means 28 into treatment container 10. And, a source gas supply system 6 or other gas supply system (if any other gas is necessary) is connected to a gas inlet 26A of shower head 26. According to the gaseous species to be used, the source gas and other gas may be mixed within shower head 26, or the source gas and other gas may be separately introduced to shower head 26 and then may be separately flowed to and mixed in treatment container 10. Although shower head 26 is used as gas introduction means 28 in this embodiment, for example, a simple nozzle may be used.

Next, source gas supply system 6 will be explained. Firstly, source gas supply system 6 includes a raw material tank 32 reserving a solid raw material or a liquid raw material. Herein, a solid raw material 34 being a source of organic metallic compound, for example, is reserved in raw material tank 32, and as mentioned above, $Ru_3(CO)_{12}$ is used as solid raw material 34. Generally, solid raw material 34 has an extreme low vapor pressure and thus dose not evaporated well. Further, instead of solid raw material 34, the liquid raw material from which the source gas is generated by bubbling thereof etc., may be used.

And, a raw material passage 38 which has one end connected to gas outlet 36 formed at the ceiling part of raw material tank 32 and the other end connected to gas inlet 26A of shower head 26 for main body 4 of the film forming apparatus is provided, so that the source gas generated in raw material tank 32 can be supplied to shower head 26. And, an open/close valve 40 is provided at the part of raw material passage 38 adjacent to raw material tank 32

In addition, a carrier gas pipe 42 for supplying carrier gas to raw material tank 32 is connected to a lower surface side of raw material tank 32. Flow rate controller 44 such as mass flow controller and open/close valve 46 for controlling the flow rate of the carrier gas are sequentially provided at carrier gas pipe 42. With these configurations, it is possible to supply the carrier gas while controlling the flow rate of the carrier gas and to heat solid raw material 34, and it is possible to vaporize solid raw material 34 so as to generate the source gas.

Further, in the inside of raw material tank 32, a porous plate 48 is provided at a region adjacent to a side on which carrier gas pipe 42 is installed. Solid raw material 34 is held over the porous plate 48. Carrier gas supplied from carrier gas pipe 42 is uniformly supplied into raw material tank 32 through the pore parts formed at porous plate 48. In this embodiment, CO (carbon monoxide) gas is used as a carrier gas.

And, a tank heating means 50 for heating raw material tank 32 is provided therein so as to surround the raw material tank 32 entirely, so that the vaporization of solid raw material 34 can be promoted. In this case, the heating temperature of solid raw material 34 is lower than a decomposition temperature. A bypass pipe 52 is provided for communicating the upstream side of open/close valve 46 for the carrier gas of carrier gas pipe 42 with the downstream side of open/close valve 40 of raw material passage 38. Bypass pipe 52 is provided with a bypass open/close valve 54 and if necessary, it is possible to allow the carrier gas to bypass raw material tank 32. Also, a heating means (not shown) such as a tape heater is provided in raw material passage 38, so as to prevent the source gas from being resolidified.

Next, exhaust system 8 will be explained. Exhaust system 8 includes an exhaust passage 60 connected to exhaust outlet 20 of treatment container 10. The atmosphere in treatment container 10 is adapted to be evacuated along exhaust passage 60. Specifically, in exhaust passage 60, a pressure regulating valve 62, a vacuum pump unit 64, an auxiliary trapping mechanism 66, a trapping mechanism 68 according to the present invention, and a detoxifying device 70 are sequentially provided from the upstream side toward the downstream side thereof.

Pressure regulating valve 62 is constituted with a butterfly valve, for example, and has a function to regulate the pressure in treatment container 10. Vacuum pump unit 64 includes a turbo molecular pump 64A provided at the upstream side thereof and a dry pump 64B provided in the downstream side thereof, in this embodiment, and is configured to allow the atmosphere in treatment container 10 to be evacuated. In this case, depending on the setting process pressure when performing a film forming process, only one of two pumps 64A, 64B may be provided.

Although auxiliary trapping mechanism 66 is configured to recover an unreacted source gas contained in the exhaust gas by cooling exhaust gas flowing thereinto, in this embodiment, the auxiliary trapping mechanism is provided in the front stage of main trapping mechanism 68 so as to recover a part of unreacted source gas and functions in a particularly effective manner when the quantity of the unreacted source gas is too large or the recovery capability of main trapping mechanism 68 in a rear stage is not sufficiently large. Accordingly, when the quantity of the unreacted source gas is small or the recovery capability of main trapping mechanism 68 in the rear stage is sufficiently large, auxiliary trapping mechanism 66 may be omitted. As auxiliary trapping mechanism 66, a Cryo pump having a Cryo panel formed with an extremely low temperature may be used, for example, and the unreacted source gas is cooled and adsorbed to the Cryo panel.

Further, trapping mechanism 68 of the present embodiment is adapted to recover an unreacted source gas contained in the exhaust gas by cooling exhaust gas flowing thereinto, as in auxiliary trapping mechanism 66, and most of the unreacted source gas, that is, most of $Ru_3(CO)_{12}$ gas is recovered. The configurations of trapping mechanism 68 will be explained later.

Also, detoxifying device 70 makes the harmful gas in the exhaust gas to be harmless. Herein, since the source gas is decomposed to generate a CO (carbon monoxide) gas and this CO gas is used as a carrier gas, the CO gas becomes harmless $CO_2$ (carbon dioxide) by combustion, for example, and then diffuses to the atmosphere.

Next, trapping mechanism 68 will be explained. Essentially, trapping mechanism 68 includes a solidification unit 72 for solidifying the unreacted source gas by cooling the exhaust gas which is accomplished by bringing the exhaust gas into contact with the refrigerant and reprecipitating the raw material, and a filtration recovery unit 74 for separating and recovering the reprecipitated raw material from the refrigerant, by filtering the refrigerant in solidification unit 72.

As shown in FIG. 2A, solidification unit 72 is constituted by a scrubber device 73, for example. Specifically, solidification unit 72 includes a cylindrical solidification container 76 which is provided at the top part of the side wall thereof with a gas inlet 78. One side of exhaust passage 60 is connected to gas inlet 78, a gas outlet 80 is formed at the central part of the side wall opposite to gas inlet 78 or a part slightly below the central part, and the other side of exhaust passage 60 is connected to gas outlet 80.

With these configurations, the exhaust gas is configured to flow into solidification container 76 through gas inlet 78 and flow out through gas outlet 80. Also, it may be possible to lengthen a flowing passage length of the exhaust gas flowing in solidification container 76 by suitably providing a baffle plate within solidification container 76.

Further, the inside of solidification container 76 is provided at its ceiling part with shower head 82 having a plurality of nozzles 82A. A liquid supply pipe 84 is connected to shower head 82 for allowing the refrigerant to flow through the liquid supply pipe. Accordingly, in the inside of solidification container 76, the refrigerant is discharged in a shower shape from each nozzle 82A of shower head 82 and brought into contact with the exhaust gas, thereby cooling the exhaust gas.

An insoluble or sparingly soluble refrigerant for the raw material, for example, a cooling water is used as the refrigerant, and the unreacted source gas in the exhaust gas is solidified by cooling with the refrigerant thereby reprecipitating $Ru_3(CO)_{12}$ as the raw material. Cooling water is used as the refrigerant because $Ru_3(CO)_{12}$ is not dissolved in the cooling water and thus has a stable property.

In addition, solidification container 76 is formed at its bottom part 76B with a liquid outlet 86 and a liquid inlet 88. In this case, it may be possible to form the bottom part 76B of solidification container 76 in an inverse cone or inverse polypyramid shape projecting downwardly as shown in FIG. 2B, to form liquid outlet 86 at the lowest end part thereof, and thus to discharge the reprecipitated raw material easily. Filtration recovery unit 74 is provided at a circulation passage 90 formed by connecting liquid outlet 86 and liquid inlet 88. A circulation pump 92 (see FIG. 1) is also provided at circulation passage 90, and the refrigerant including the raw material reprecipitated in solidification container 76 is adapted to circulate in circulation passage 90.

Furthermore, at the upstream side from circulation pump 92 of circulation passage 90, a recovery container 96 is provided for recovering the reprecipitated raw material from the refrigerant. Herein, circulation passage 90 is divided into two branch pipes 90A, 90B arranged in parallel, and each of branch pipes 90A, 90B is provided with recovery containers 96A, 96B (96), respectively. And, two open/close valves 98A, 98B are provided at the immediate upstream side and the immediate downstream side of each recovery container 96A, 96B, respectively, and each of recovery containers 96A, 96B can be used selectively by operating open/close valves 98A, 98B.

And, filters 100A, 100B are respectively installed within each recovery container 96A, 96B in exchangeable manner, and it is possible to recover the reprecipitated raw material by filtering the refrigerant by using filters 100A, 100B.

Further, a discharge pipe 104 provided with open/close valve 102 for discharging is branched from circulation passage 90 between circulation pump 92 and recovery container 96, and thus, it is possible to discharge the excessive refrigerant out of the systems, if necessary. In this embodiment, a discharge passage 60 from discharge opening 20 of treatment container 10 to auxiliary trapping mechanism 66 (trapping mechanism 68 when the auxiliary trapping mechanism is not provided) and each member provided in the discharge passage are provided with a passage heater 106 such as tape heater. With the passage heater, though depending on the raw material used, the exhaust gas flowing through exhaust passage 60 is heated to a temperature of 110° C., for example, in this embodiment, so that the unreacted source gas in the exhaust gas is prevented from being condensed or solidified therein.

And, in order to control the entire operations of film forming apparatus 2 configured as mentioned above, a device controller 108 including a computer, for example, is installed. By the device controller, various controls are performed such as control for the start and the stop of supplying of each gas, control for the process temperature, control for the process pressure, control for the supply of the refrigerant at trapping mechanism 68, control for the refrigerant circulation, and control for the conversion of filtration recovery unit 74.

Device controller 108 includes a storage medium 110 for storing a computer program for performing the above controls. As storage medium 110, a flexible disc, a CD (Compact Disc), a CD-ROM, a hard disk, a flash memory, and a DVD can be used. Also, auxiliary trapping mechanism 66 may be provided between pressure regulating valve 62 and turbo molecular pump 64A, or between turbo molecular pump 64A and dry pump 64B.

Figure 3:
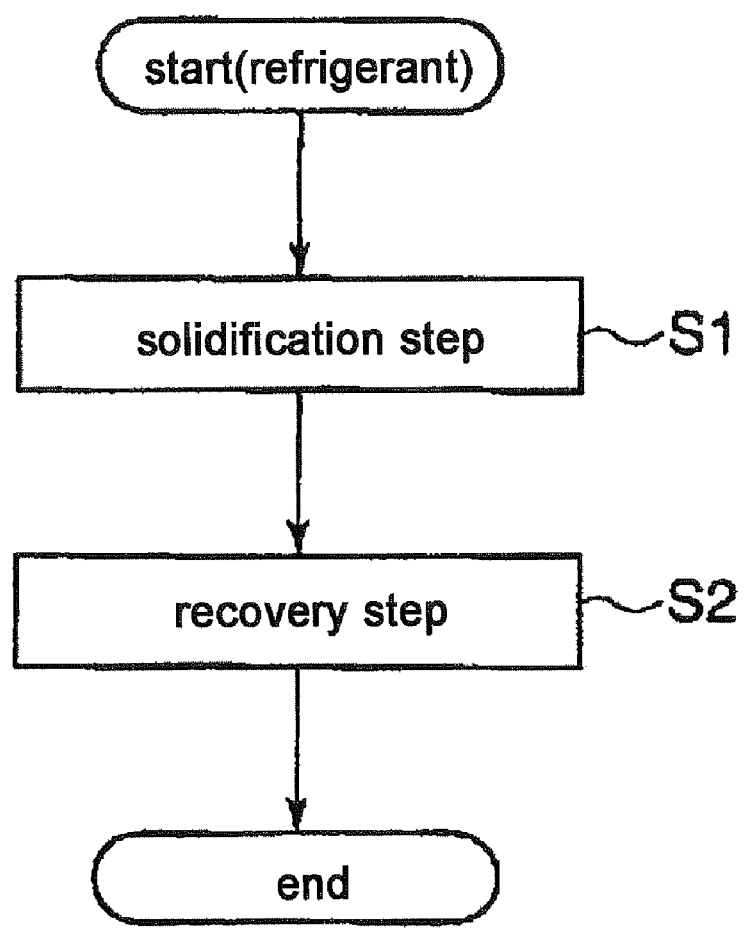
FIG. 3 is a flow chart explaining the raw material recovery method, according to one embodiment of the present invention.

Next, the operations of film forming apparatus 2 configured as mentioned above will be explained by referring to FIG. 3. FIG. 3 is a flow chart explaining a raw material recovery method according to one embodiment of the present invention.

Firstly, as shown in FIG. 1, in main body 4 of film forming apparatus 2, the inside of treatment container 10 is evacuated to be maintained at a predetermined pressure by continuously driving turbo molecular pump 64A and dry pump 64B of vacuum pump unit 64 in exhaust system 8. Also, semiconductor wafer W on placing table 16 is maintained at a predetermined temperature by heating means 18. Also, the side wall of treatment container 10 and shower head 26 are maintained at a predetermined temperature by a heating means (not shown) on container side, respectively.

In addition, the entire source gas supply system 6 is heated to a predetermined temperature by tank heating means 50 or a passage heating means (not shown). And, when the film forming process starts, in source gas supply system 6, carrier gas (CO) with controlled flow rate is supplied through carrier gas pipe 42 to raw material tank 32, and solid raw material 34 reserved in raw material tank 32 is heated and vaporized, thereby generating a source gas.

The generated source gas flows toward the downstream side together with the carrier gas in raw material passage 38. The source gas is introduced from shower head 26 of main body 4 of the film forming apparatus into treatment container 10 at a reduced pressure atmosphere. In treatment container 10, a thin film of Ru metal is formed on wafer W by CVD (Chemical Vapor Deposition), for example. The process condition at this time includes a process pressure of 0.1 Torr (13.3 Pa), a wafer temperature of 200° C.~250° C. and a side wall temperature of treatment container 10 of 75° C.~80° C.

Herein, $Ru_3(CO)_{12}$ as solid raw material 34 is a raw material which has a very low vapor pressure and thus is not evaporated (vaporized) well. Also, the quantity of $Ru_3(CO)_{12}$ which contributes to the film forming reaction is very small. In an unreacted state, approximately 90% of the source gas flows downward in exhaust passage 60 of exhaust system 8 together with CO as the carrier gas. The reactions at this time are expressed by following formulas, and CO (carbon monoxide) being the same gas species as the carrier gas is generated by the reaction.

$$Ru_3(CO)_{12} \Leftrightarrow Ru_3(CO)_{12}\uparrow$$

$$Ru_3(CO)_{12}\uparrow \Leftrightarrow Ru_3(CO)_{12-x}\uparrow + XCO\uparrow$$

$$Ru_3(CO)_{12-x}\uparrow + Q \rightarrow 3Ru + (12-X)CO\uparrow$$

$$Ru_3(CO)_{12}\uparrow + Q \rightarrow 3Ru + 12CO\uparrow$$

In the above chemical formula, $\Leftrightarrow$ represents a reversible reaction, "↑" represents a gas phase, and the elements having no "↑" represent a solid phase. "Q" represents applying calorie.

Exhaust gas flowing downward in exhaust passage 60 sequentially passes through pressure regulating valve 62, turbo molecular pump 64A, dry pump 64B, auxiliary trapping mechanism 66, trapping mechanism 68 and detoxifying device 70. And then, the exhaust gas diffuses to the atmosphere. In this case, the exhaust gas exhausted after the unreacted source gas is recovered contains CO gas only. The CO gas becomes harmless by combustion at detoxifying device 70 and is diffused to the atmosphere.

Herein, when the exhaust gas passes through auxiliary trapping mechanism 66 constituted by Cryo pump, for example, the exhaust gas is cooled by the Cryo panel, a part of the unreacted source gas is condensed (solidified) and is attached to the Cryo panel. And, the reprecipitated raw material is recovered.

The exhaust gas flowed out from auxiliary trapping mechanism 66 is introduced into trapping mechanism 68. Herein, most of the unreacted source gas is recovered by bring the exhaust gas into contact with the refrigerant. As shown in FIG. 3, the raw material recovery method includes a solidification step (step S1) in which the unreacted source gas is solidified by cooling the exhaust gas by bringing the exhaust gas into contact with the refrigerant and reprecipitating the raw material, and a recovery step (step S2) for separating and recovering the raw material reprecipitated in the solidification step from the refrigerant.

Figure 2:
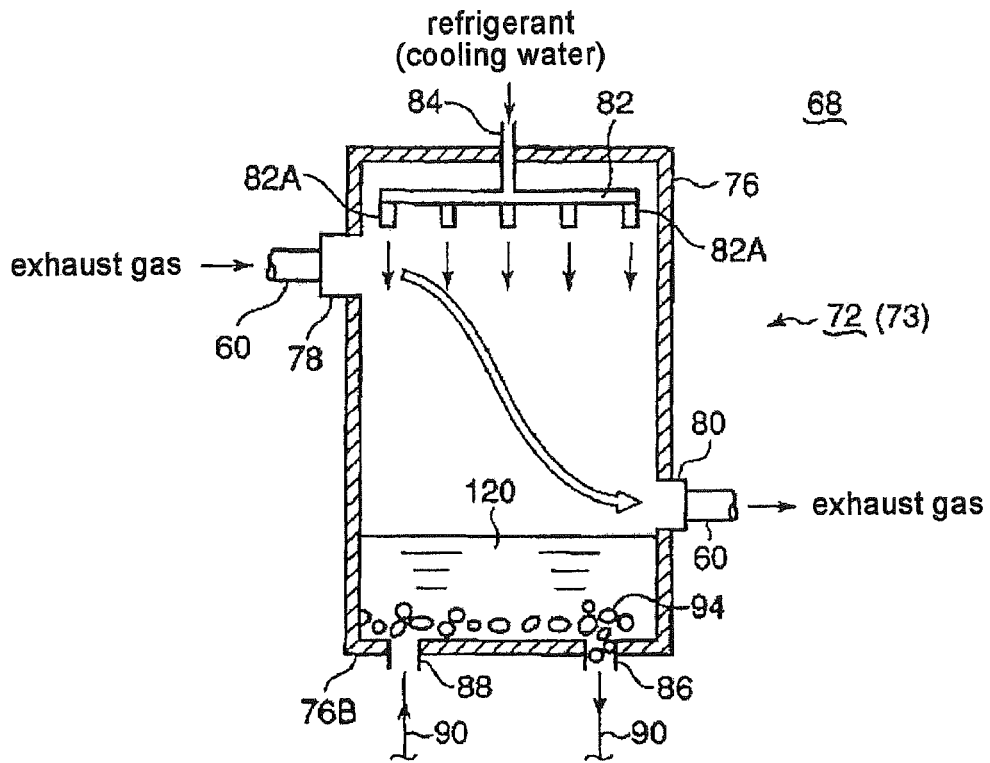
FIG. 2A and FIG. 2B are cross-sectional configuration view illustrating one example of a solidification unit included in the trapping mechanism.
Figure 2:
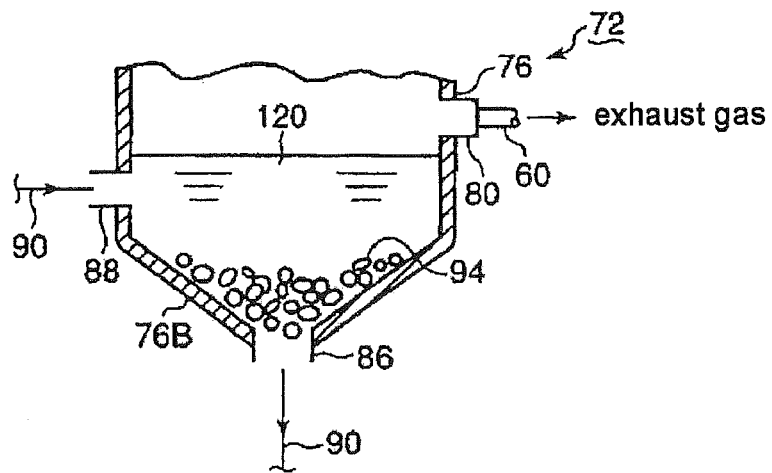

Specifically, as shown in FIG. 2, in solidification unit 72, the exhaust gas introduced into solidification container 76 through gas inlet 78 is cooled by contact with the refrigerant ejected from each nozzle 82A of shower head 82 provided in the ceiling part, and then discharged through gas outlet 80. Herein, when the exhaust gas is cooled by contacting with the refrigerant (in this embodiment, cooling water), the unreacted source gas contained in the exhaust gas is cooled and condensed (solidified), and the raw material is reprecipitated. In this case, it is preferred that the temperature of the cooling water is 0° C.~30° C., for example, though the temperature depends on the vaporization temperature (sublimation temperature) of the raw material. Also, shower heads 82 may be installed over a plurality of stages in a vertical direction.

Herein, raw material 94 reprecipitated by condensation gathers together with refrigerant (cooling water) 120 at the bottom part of solidification container 76. Further, CO gas used as the carrier gas is not melt substantially in the cooling water.

And, since circulation pump 92 of filtration recovery unit 74 is running, refrigerant 120 in solidification container 76 flows out into circulation passage 90 through liquid outlet 86, and passes through circulation passage 90. And then, refrigerant 120 returns to solidification container 76 through liquid inlet 88 so as to circulate. In this case, refrigerant 120 passing through circulation passage 90 flows into any one of two recovery containers 96A, 96B. For example, when the refrigerant flows into recovery container 96A, open/close valve 98A is in an open state and open/close valve 98B is in a closed state. That is, this indicates that recovery container 96A is selected.

When refrigerant 120 flows into recovery container 96A, reprecipitated raw material 98 contained in refrigerant 120 is filtered by filter 100A to be collected in filter 100A and then recovered. In this case, since $Ru_3(CO)_{12}$ used as the raw material is not melt substantially in the cooling water used as the refrigerant, most of raw material 98 which was contained in refrigerant 120 and reprecipitated, is filtered by filter 100A to be recovered.

And, when a certain amount of raw material 94 has been recovered, a recovery container 96A being used is switched into another recovery container 96B by operating both open/close valves 98A, 98B. And then, reprecipitated raw material in the refrigerant is recovered by filtering the refrigerant as mentioned above. In this manner, the film forming process is performed continuously while using both recovery containers 96A, 96B alternately. In this case, it is a matter of choice that only one recovery container 96 may be employed, or three or more recovery containers may be employed in parallel. Further, since recovered raw material 94 contains no impurities, it is not necessary to refine the raw material. Accordingly, after the recovered raw material is dried, the recovered raw material can be used as it is, as solid raw material 34 in raw material tank 32.

As such, according to the present embodiment, when raw material 34 of an organic metallic compound which has the property of being stable toward specific refrigerant 120 without being decomposed, is used to form a thin film on the surface of an object to be treated, for example, semiconductor wafer W, the unreacted source gas is solidified by cooling the exhaust gas by bringing the exhaust gas into contact with the refrigerant and reprecipitated as the raw material, and the raw material is separated from the refrigerant. In this way, it is possible to recover the unreacted raw material in an easy and simple manner. Since it is possible to recover and recycle the raw material effectively, an operating cost is significantly reduced particularly when the raw material is expensive.

<Modified Embodiment of the Solidification Unit>

Figure 4:
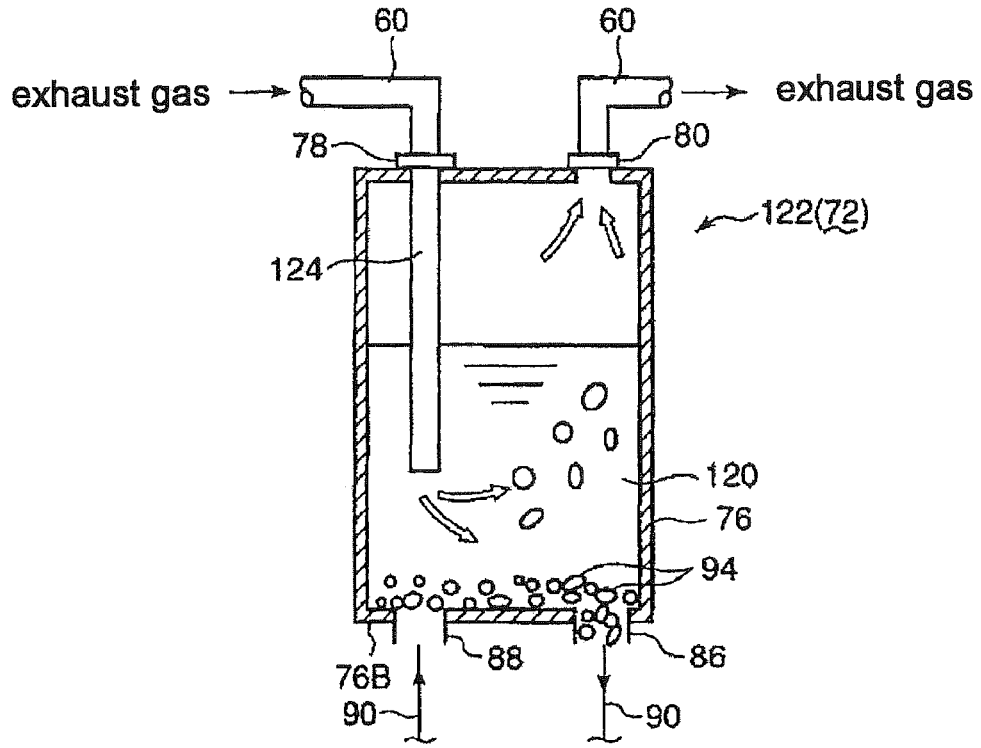
FIG. 4A and FIG. 4B are schematic cross-section view illustrating a modified embodiment of the solidification unit.
Figure 4:
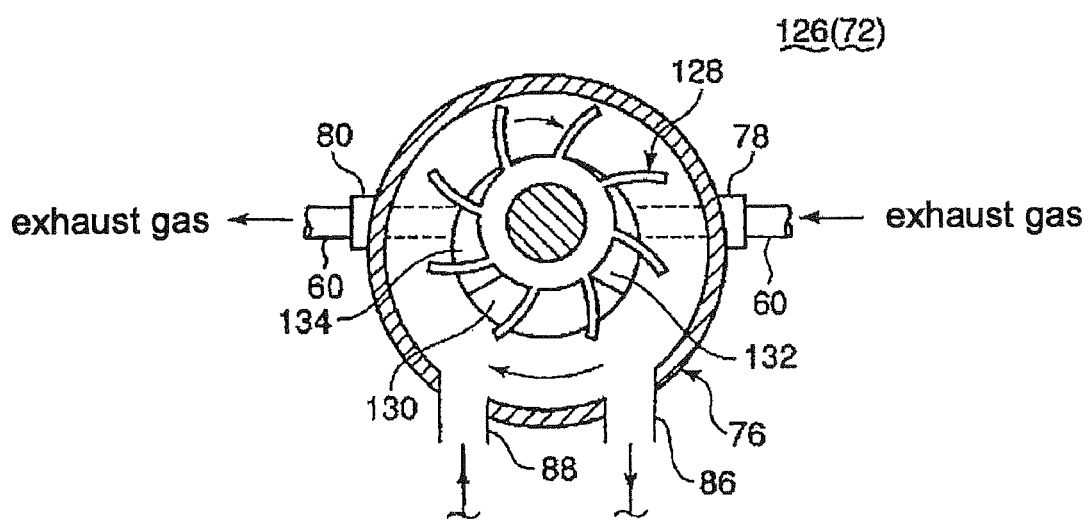

Next, modified embodiment of the solidification unit will be explained. Although, in previous embodiment, a case in which scrubber device 73 is used as solidification unit 72 is explained as an example, the present invention is not limited to such a case, but a bubbling device or water ring pump device may be used as well. FIG. 4 is a schematic cross-section view illustrating the modified embodiment of the solidification unit. In FIG. 4, same components as the components shown in FIG. 2 are designated with the same reference numerals as that in FIG. 2, and the description thereof will be omitted.

In a case of FIG. 4A, instead of scrubber device 73 in the previous embodiment, a bubbling device 122 is used as solidification unit 72. In bubbling device 122, a gas inlet 78 and a gas outlet 80 are formed at the ceiling part of solidification container 76, respectively. And, a bubbling pipe 124 is connected to gas inlet 78 and the front end of the lower side of bubbling pipe 124 is immersed into refrigerant (cooling water) 120 reserved in solidification container 73.

With these configurations, the exhaust gas is discharged from the lower end of bubbling pipe 124 into refrigerant 120 so as to be cooled, so that the unreacted source gas contained in the exhaust gas is solidified and reprecipitated as raw material 94. In this case, it is also possible to obtain a similar effect as in the previous embodiment.

In the case of FIG. 4B, instead of using scrubber device 73 in the previous embodiment, a water ring pump device 126 is used as solidification unit 72. In water ring pump device 126, the cooling water (not shown) used as refrigerant is introduced into the inside of solidification container 76 constituted by a cylindrical casing with a circular cross-section. And an impeller 128 which rotates in an eccentricity condition is provided in the inside of cylindrical solidification container 76. When an impeller 128 is rotated, the cooling water flows along the inner wall of solidification container 76 so as to cause a circular flow to be generated. And, a space part 130 in a crescent shape is formed therein.

An independent air chamber defined by two adjacent blades of impeller 128 and an inner side of the circular flow is repeatedly expanded and contracted, along with the rotation of impeller 128. On a side part of the air chamber, an intake opening 132 and an exhaust opening 134 are formed, respectively. And, intake opening 132 is connected to gas inlet 78, and exhaust opening 134 is connected to gas outlet 80. Further, on a part of solidification container 76 used as casing, a liquid outlet 86 and a liquid inlet 88 are formed, respectively. Also, when water ring pump device 126 is used, the cooling water and the exhaust gas are effectively contacted to each other to cause the exhaust gas to be cooled, and the unreacted source gas contained in the exhaust gas is solidified and reprecipitated as raw material (not shown). In this case, it is also possible to obtain a similar effect as in the previous embodiment.

<Modified Embodiment of Trapping Mechanism 68>

Next, descriptions will be made for a modified embodiment of trapping mechanism 68. Although, in previous embodiment, a case in which the refrigerant is used at trapping mechanism 68 is explained as an example, a solvent which dissolves the unreacted raw material may be used instead.

Figure 5:
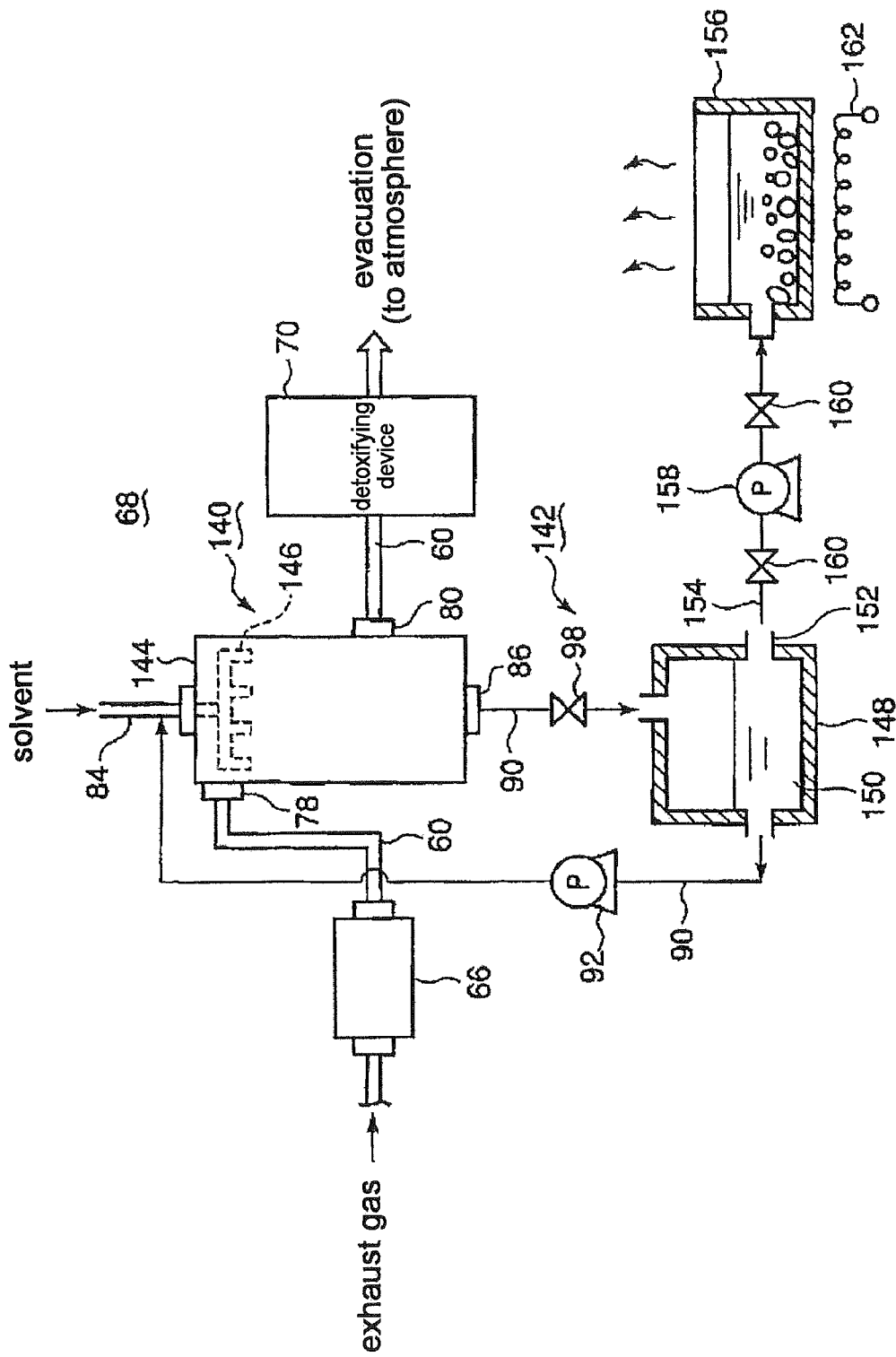
FIG. 5 is a configuration view illustrating modified embodiment of the trapping mechanism.
Figure 6:
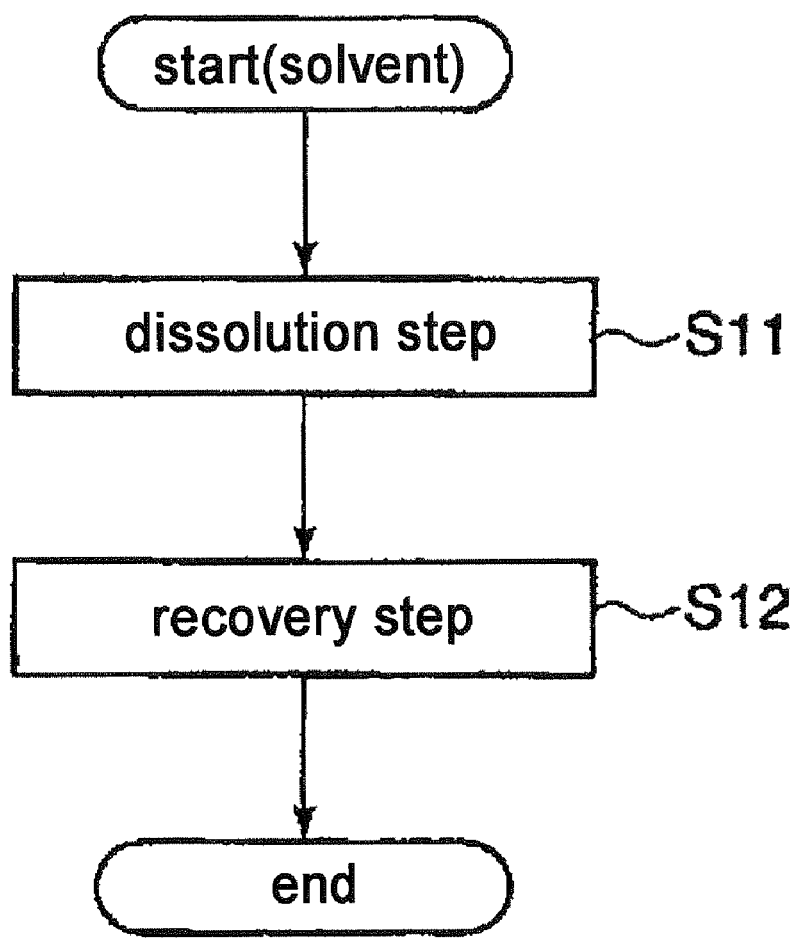
FIG. 6 is a flow chart illustrating a raw material recovery method when the modified embodiment of the trapping mechanism is used.

FIG. 5 is a configuration view illustrating modified embodiment of the trapping mechanism. FIG. 6 is a flow chart explaining a raw material recovery method when the modified embodiment of the trapping mechanism is used. In FIG. 5, the same component as the component shown in FIGS. 1 and 2 is designated with same reference numerals as that in FIG. 2 and the description thereof will be omitted.

As shown in FIG. 5, trapping mechanism 68 includes a dissolution unit 140 for dissolving the unreacted source gas contained in the exhaust gas by bringing the exhaust gas into contact with the solvent, and a evaporation recovery unit 142 for reprecipitating and recovering the raw material dissolved in the solvent by evaporating the solvent extracted from dissolution unit 140.

As dissolution unit 140, a dissolution container 144 having an substantially same configuration as solidification container 76 (see FIG. 2) described in FIGS. 1 and 2 is used, and shower head 146 is provided in the inside of dissolution container 144. In this embodiment, the solvent is used instead of the refrigerant, as mentioned above. That is, the solvent is adapted to be discharged from shower head 146. As the solvent, for example, alcohols such as ethylene glycol, methanol, ethanol, 1-butanol, 1-propanol and 2-propanol, alkanes such as pentane, hexane and heptane, ethers such as diethyl ether and THF, and aromatic hydrocarbons such as toluene and xylene can be used. Specifically, as the solvent, at least one of the solvents selected from the group mentioned above may be used.

Further, in this embodiment, only liquid outlet 86 is formed at the bottom part of dissolution container 144, and the front end of circulation passage 90 of evaporation recovery unit 142 coupled to the liquid outlet 86 is connected to a liquid supply pipe 84 coupled to shower head 146. With this configuration, the solvent in dissolution container 144 can be supplied to shower head 146 and thus can be used in a circulation manner.

Further, at circulation passage 90, an open/close valve 98, a solvent reservation tank 148 and a circulation pump 92 are sequentially provided along the flow direction thereof. Solvent reservation tank 148 can temporarily reserve solvent 150 in which the unreacted source gas is dissolved. Solvent reservation tank 148 is provided at the lower part of a side wall with a liquid recovery opening 152 which is connected to an evaporation tank 156 through a recovery pipe 154.

In addition, a recovery pump 158 and open/close valves 160 located at both sides of the recovery pump 158 are provided in recovery pipe 154, respectively, so that solvent 150 in solvent reservation tank 148 can be extracted to evaporation tank 156, if necessary. If, for example, by providing evaporation tank 156 at a position lower than solvent reservation tank 148, solvent 150 automatically flows to evaporation tank 156 by opening of open/close valve 160, it is not necessary to provide recovery pump 158. And, evaporation tank 156 is provided with a heater 162 for evaporation, which heats the solvent in evaporation tank 156 to cause the solvent to be evaporated, and thus the raw material dissolved in the solvent can be reprecipitated and recovered.

In trapping mechanism 68 configured as mentioned above, the raw material recovery method is performed in such a manner shown in the flow chart of FIG. 6. That is, a dissolution step S11 for dissolving the unreacted source gas contained in the exhaust gas into the solvent by bringing the exhaust gas into contact with the solvent, and a recovery step S12 for reprecipitating and recovering the raw material dissolved in the solvent by evaporating the solvent, are sequentially performed. Specifically, firstly, within dissolution unit 140, the exhaust gas is brought into contact with the solvent ejected from shower head 146 and the unreacted source gas contained in the exhaust gas is dissolved in the solvent. And, as the solvent, there is used a solvent that hardly dissolves the CO gas generated by the decomposition of the carrier gas and the raw material.

The solvent is used in a circulation manner by passing through circulation passage 90 of evaporation recovery unit 142 and solvent reservation tank 148, and repeatedly ejected from shower head 146 into dissolution container 144. And, when the concentration of the raw material dissolved in the solvent rises to a certain level, a part of solvent 150 within solvent reservation tank 148 is extracted toward recovery pipe 154 and reserved in evaporation tank 156, by opening open/close valve 160 of recovery pipe 154 to drive recovery pump 158.

The shortage of the solvent due to the extraction is separately supplemented, and the film forming process is performed continuously. And, the solvent extracted into evaporation tank 156 is heated by heater 162 to be evaporated, and thus the raw material dissolved in the solvent can be reprecipitated and recovered.

In this case, since the raw material is simply dissolved in the solvent without being decomposed, the raw material can be recovered separately. Also, in this case, since the recovered raw material contains no impurities, it is not necessary to refine the raw material. Accordingly, after the recovered raw material is dried, the recovered raw material can be used as it is as solid raw material 34 in raw material tank 32.

As such, according to the present embodiment, when forming a thin film on the surface of an object to be treated, for example, the semiconductor wafer by using a raw material of an organic metallic compound which is dissolved in a specific solvent, the unreacted source gas is dissolved by bringing the exhaust gas into contact with the solvent, and the solvent is evaporated to cause the raw material to be reprecipitated. In this way, it is possible to recover the unreacted raw material in an easy and simple manner.

Although, in the example explained with respect to FIG. 5, the solvent is repeatedly used in a circulation manner, the present invention is not limited to the example. When the solvent has been ejected to dissolution container 144 at once, that is, one pass of the solvent has been performed, it may be possible to introduce the solvent into evaporation tank 156 directly. Or the solvent may be introduced into evaporation tank 156 via solvent reservation tank 148 for causing the evaporation recovery process to be performed.

In addition, bubbling device 122 or water ring pump device (liquid ring pump device) 126 explained with respect to FIGS. 4A and 4B may be used as dissolution unit 140. When water ring pump device 126 is used, the solvent is used instead of water.

Further, it may be possible to recover raw material 94 by introducing the raw material reprecipitated by solidification unit 72 (scrubber device 73, bubbling device 122, water ring pump device 126, etc.,) explained in the previous embodiment, together with the refrigerant into evaporation tank 156, and by heating and evaporating the refrigerant by heater 162 for evaporation.

EVALUATION OF THE PRESENT INVENTION

Figure 7:
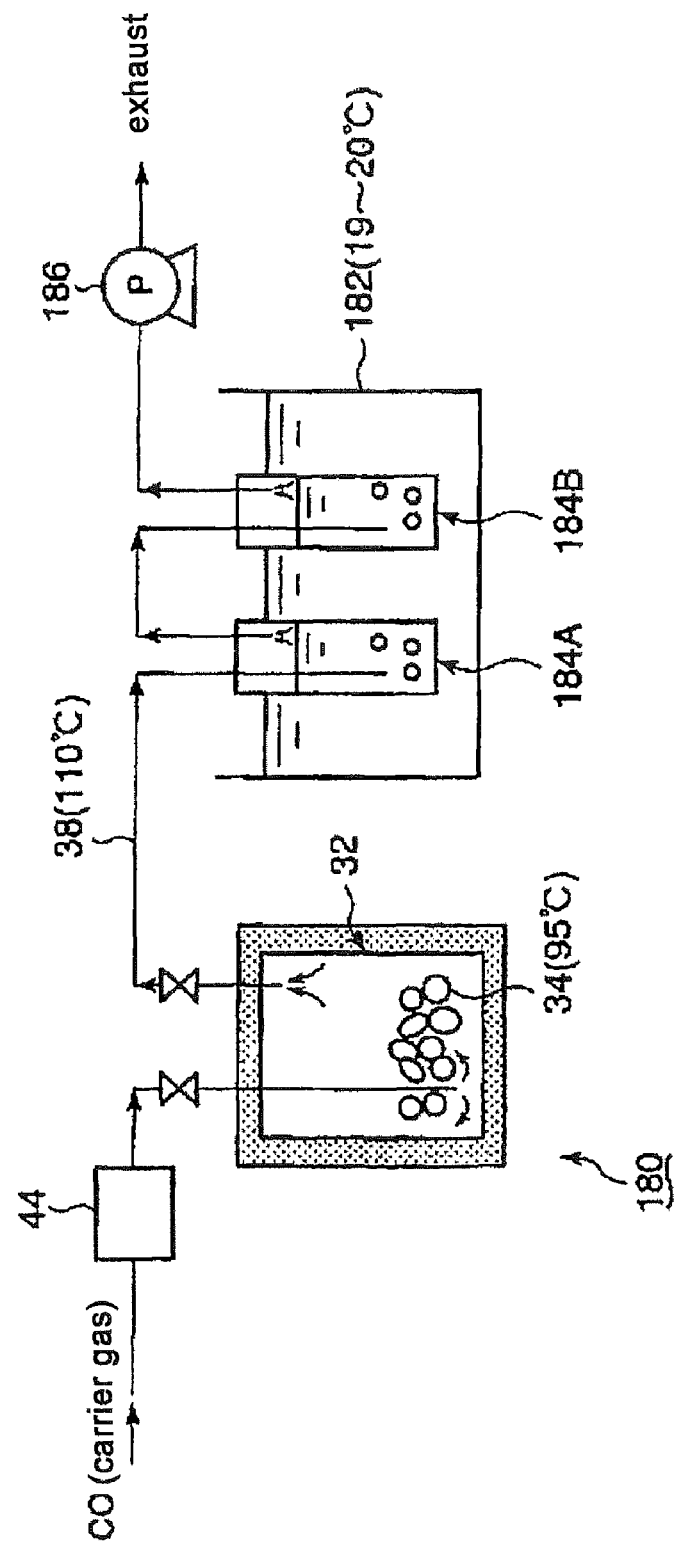
FIG. 7 is a view illustrating an example of the apparatus when an evaluation experiment is performed by using a bubbling device as the trapping mechanism.

Herein, an experiment for the film forming process was performed while using the film forming apparatus including the trapping mechanism. The evaluation result of the experiment will be explained below. Also, among the previous embodiments, the bubbling device as shown in FIG. 4A was used to perform the experiment. FIG. 7 is a view illustrating an exemplary apparatus when an evaluation experiment is performed by using a bubbling device as the trapping mechanism.

In the exemplary apparatus, a source gas supply system 180 having the same configuration as source gas supply system 6 shown in FIG. 1 was used, and $Ru_3(CO)_{12}$ used as solid raw material 34 in raw material tank 32 was vaporized so as to be carried by the carrier gas consisting of the CO gas. At this time, raw material tank 32 was heated to a temperature of 95° C. by an oven and the pressure in the raw material tank was set to 340 Torr (45322 Pa). In this evaluation experiment, two bubbling devices 184A, 184B were installed in a water bath 182 maintained with a temperature of 19° C.~20° C. and connected to each other in series within raw material passage 38. And, two bubbling devices were evacuated from the downstream side by dry pump 186 so as to cause the raw material gas to flow therein. At this time, raw material passage 38 was heated to a temperature of 110° C. so that the source gas was prevented from being recondensed (solidified) therein.

By using the exemplary apparatus, the source gas was allowed to flow for 81.9 hours. At this time, the flow rate of the CO gas was 1 slm. Accordingly, an input amount of solid raw material 34 was 1.43 g. Also, a collected amount of bubbling device 184A at first stage was 1.36 g and a collected amount of bubbling device 184B at second stage was 0.02 g. As a result, a collected rate equals to (1.36+0.02)/1.43=0.97 (97%), and thus it was found that $Ru_3(CO)_{12}$ was recovered at a high collection rate. Further, it was found out that it was not necessary to provide the bubbling device at a plurality of stages, and providing the bubbling device at one stage was sufficient to collect the raw material.

Also, instead of two bubbling devices 184A, 184B, two membrane filters (porous film-type filters) having high performance were provided, and a collection experiment as mentioned above was performed for 15.5 hours. As a result, in a case that an input amount of solid raw material 34 was 0.27 g, the collected amount at the two filters was 0.23 g. Accordingly, the collected rate was 85%. That is, it was also found out that $Ru_3(CO)_{12}$ was recovered at a high collection rate.

Accordingly, it was found out that the raw material gas was recovered merely by bringing the exhaust gas into contact with the water as the refrigerant. Also, those skilled in the art would appreciate that the enough raw material is recovered and collected when the scrubber device as shown in FIG. 2 or the water ring pump device as shown in FIG. 4B was used.

Further, although, in the above each embodiment, a case is described as an example in which $Ru_3(CO)_{12}$ used as the carbonyl based organic metallic compound, is used as organic metallic compound of the raw material, the present invention is not limited to $Ru_3(CO)_{12}$. The carbonyl based organic metallic compound can include one or more materials selected from the group consisting of $Ru_3(CO)_{12}$, $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Os_3(CO)_{12}$, $Ta(CO)_5$.

Further, in the above embodiments, it may be possible that either one of the scrubber device shown in FIG. 2, the bubbling device shown in FIG. 4A or the water ring pump device shown in FIG. 4B is installed over a plurality of stages in series, and the exhaust gas is caused to flow through them, thereby improving the recovery rate of the raw material.

Further, although, in the above embodiments, a case in which a semiconductor wafer is used as an object to be treated, is described as an example, the semiconductor wafer can include a silicone substrate, a semiconductor substrate of compounds such as GaAs, SiC, and GaN. Furthermore, the present invention is not limited to these substrates and the present invention can be applied to other substrates such as a glass substrate or a ceramic substrate used in a liquid crystal device.

The invention claimed is:

1. A method for recovering a raw material of an organic metallic compound, which has the property of being stable toward a specific refrigerant without being decomposed thereby, from exhaust gas discharged from a treatment container in which a metallic thin film is formed on a surface of an object to be treated by using source gas obtained by vaporizing the raw material, the method comprising:
    solidifying an unreacted source gas by cooling the exhaust gas by bringing the exhaust gas into contact with the refrigerant, thereby reprecipitating the raw material; and
    separating the raw material reprecipitated in the solidification step from the refrigerant,
    wherein the organic metallic compound is carbonyl based organic metallic compound.

2. The method as claimed in claim 1, wherein in the recovery step, a filtration method for filtering the refrigerant or an evaporation method for evaporating the refrigerant is used.

3. The method as claimed in claim 1, wherein the refrigerant is a cooling water.

4. The method as claimed in claim 1, wherein the carbonyl based organic metallic compound includes one or more material selected from the group consisting of $Ru_3(CO)_{12}$, $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Os_3(CO)_{12}$, $Ta(CO)_5$.

5. A trapping mechanism for recovering a raw material of an organic metallic compound, which has the property of being stable toward a specific refrigerant without being decomposed thereby, from exhaust gas discharged from a treatment container in which a metallic thin film is formed on a surface of an object to be treated by using source gas obtained by vaporizing the raw material, the trapping mechanism comprising:
    a solidification unit configured to solidify an unreacted source gas by cooling an exhaust gas by bringing the exhaust gas into contact with a refrigerant, thereby reprecipitating the raw material; and
    a filtration recovery unit configured to separate the raw material reprecipitated in the solidification unit from the refrigerant by filtering the refrigerant in the solidification unit,
    wherein the organic metallic compound is carbonyl based organic metallic compound.

6. The trapping mechanism as claimed in claim 5, wherein the solidification unit uses a cooling water as the refrigerant.

7. The trapping mechanism as claimed in claim 6, wherein the solidification unit includes any one device selected from the group consisting of a scrubber device, a water ring pump device and a bubbling device.

8. The trapping mechanism as claimed in claim 5, wherein the filtration recovery unit includes a circulation passage which is provided with a circulation pump and circulates the refrigerant containing the reprecipitated raw material in the solidification unit and a recovery container which is provided in the circulation passage and has a filter recovering the reprecipitated raw material from the refrigerant by filtration.

9. The trapping mechanism as claimed in claim 8, wherein a plurality of the recovery containers having the filter are provided in parallel so as to be used selectively with respect to the circulation passage.

10. The trapping mechanism as claimed in claim 5, wherein the carbonyl based organic metallic compound includes one or more material selected from the group consisting of $Ru_3(CO)_{12}$, $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Os_3(CO)_{12}$, $Ta(CO)_5$.

11. An exhaust system to be connected to a treatment container in which a metallic thin film is formed on a surface of an object to be treated by using a source gas obtained by vaporizing a raw material of an organic metallic compound which has the property of being stable toward a specific refrigerant without being decomposed, the exhaust system comprising:
    an exhaust passage connected to an outlet of the treatment container;
    a vacuum pump unit provided in the exhaust passage;
    the trapping mechanism according to claim 5 and provided in the exhaust passage; and
    a detoxifying device configured to make a harmful gas in the exhaust gas harmless and provided at a downstream of the trapping mechanism.

12. The exhaust system as claimed in claim 11, further comprising an auxiliary trapping mechanism provided at an upstream side of the trapping mechanism configured to cool the exhaust gas and recover an unreacted source gas contained in the exhaust gas.

13. The exhaust system as claimed in claim 12, wherein the auxiliary trapping mechanism includes a Cryo pump.

14. The exhaust system as claimed in claim 11, further comprising a pressure regulating valve provided in the exhaust passage configured to control the pressure in the treatment container.

15. A film forming apparatus for performing a film forming process for an object to be treated, the film forming apparatus comprising:
    a treatment container configured to be evacuated;
    means for holding the object to be treated in the treatment container,
    means for heating the object to be treated;
    means for introducing gas into the treatment container;
    a source gas supply system connected to the means for introducing gas; and
    the exhaust system according to claim 11, connected to the treatment container.

* * * * *